United States Patent [19]
Dowlatabadi

[11] Patent Number: 5,963,071
[45] Date of Patent: Oct. 5, 1999

[54] FREQUENCY DOUBLER WITH ADJUSTABLE DUTY CYCLE

[75] Inventor: Ahmad Dowlatabadi, San Jose, Calif.

[73] Assignee: Nanoamp Solutions, Inc., San Jose, Calif.

[21] Appl. No.: 09/010,805

[22] Filed: Jan. 22, 1998

[51] Int. Cl.⁶ .................................................. H03K 3/017
[52] U.S. Cl. ........................... 327/175; 327/116; 327/276
[58] Field of Search .................................... 327/116, 175, 327/176, 276, 299, 113, 114, 115, 117, 173, 174; 377/47, 48

[56] References Cited

U.S. PATENT DOCUMENTS

| | | | |
|---|---|---|---|
| 3,949,394 | 4/1976 | Kennedy | 340/347 |
| 4,042,834 | 8/1977 | Pace | 327/116 |
| 4,048,571 | 9/1977 | Jacobson | 328/20 |
| 4,052,626 | 10/1977 | Tuma et al. | 327/116 |
| 4,277,697 | 7/1981 | Hall et al. | 327/175 |
| 4,527,075 | 7/1985 | Zbinden | 327/175 |
| 4,634,987 | 1/1987 | Nolte | 328/160 |
| 4,669,099 | 5/1987 | Zinn | 377/47 |
| 4,734,591 | 3/1988 | Ichitsubo | 327/122 |
| 4,956,797 | 9/1990 | Berard | 364/703 |
| 4,967,160 | 10/1990 | Quievy et al. | 328/16 |
| 5,008,636 | 4/1991 | Markinson et al. | 331/2 |
| 5,111,066 | 5/1992 | Artieri et al. | 327/116 |
| 5,132,632 | 7/1992 | Russell et al. | 328/16 |
| 5,224,193 | 6/1993 | Risk | 385/122 |
| 5,321,734 | 6/1994 | Ogata | 377/47 |
| 5,339,052 | 8/1994 | Melse | 331/75 |
| 5,392,014 | 2/1995 | Nishida et al. | 333/218 |
| 5,426,384 | 6/1995 | May | 327/52 |
| 5,451,893 | 9/1995 | Anderson | 327/174 |
| 5,455,530 | 10/1995 | Huppenthal et al. | 327/175 |
| 5,514,990 | 5/1996 | Mukaine et al. | 327/116 |
| 5,530,387 | 6/1996 | Kim | 327/119 |
| 5,548,235 | 8/1996 | Marbot | 327/158 |
| 5,614,841 | 3/1997 | Marbot et al. | 326/52 |

OTHER PUBLICATIONS

Kim, Gyudong et al., "A Low–Voltage, Low–Power CMOS Delay Element," IEEE Journal, vol. 31, No. 7, Jul. 1996, pp. 966–971.

*Primary Examiner*—Kenneth B. Wells
*Assistant Examiner*—Minh Nguyen
*Attorney, Agent, or Firm*—Patrick T. King

[57] ABSTRACT

An adjustable duty-cycle circuit includes an EXCLUSIVE-OR circuit for combining a divided reference input signal at a frequency $f_{IN}/2$ with a variably delayed divided reference input signal to provide an output frequency $V_O$ at $f_{IN}$ with an adjustable duty cycle. A variable delay circuit, or delay line, is controlled by a control signal which is generated by comparing a signal equal to the average (DC) value of $V_O$ with an adjustable DC reference signal from a voltage divider or a DAC. An output signal from the comparator is filtered to provide the control signal $V_C$ for the delay circuit to control the duty cycle of the output signal. To provide a frequency doubler, the reference input signal is not divided by two to thereby obtain an output signal at $2f_{IN}$ with an adjustable duty cycle. Frequency multipliers for N=3, 5, 7, etc. are implemented with additional delays and exclusive logic circuits.

24 Claims, 9 Drawing Sheets

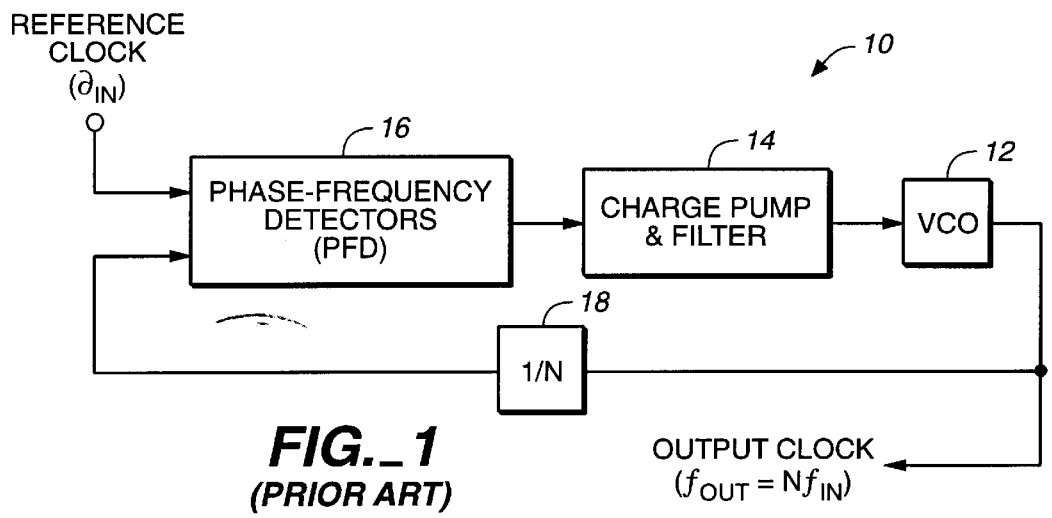
FIG._1
(PRIOR ART)
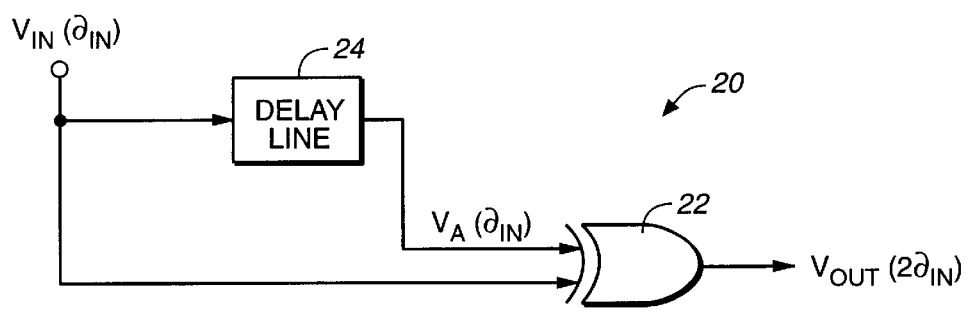
FIG._2
(PRIOR ART)
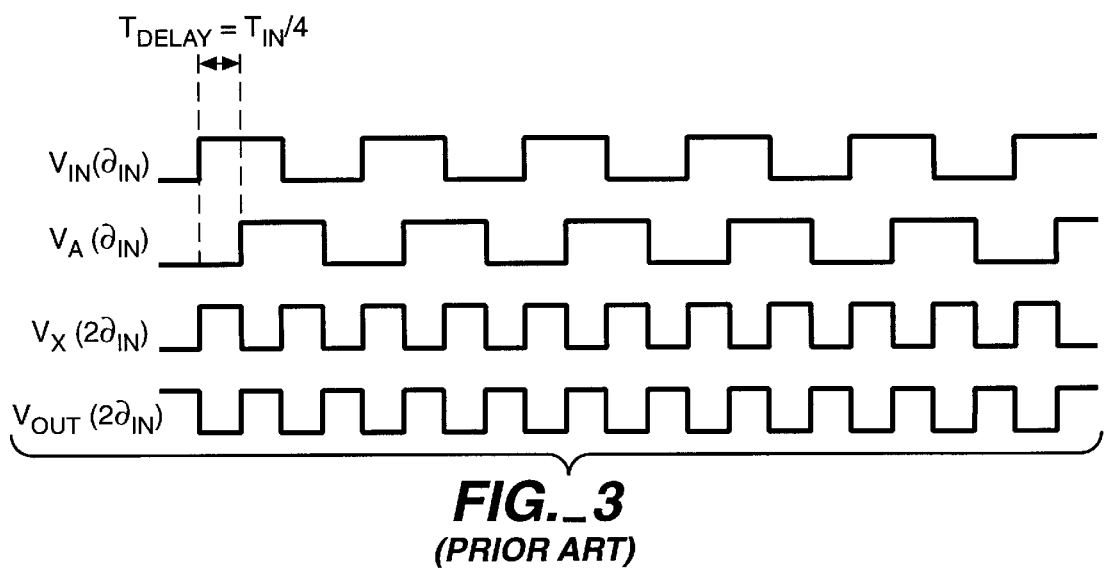
FIG._3
(PRIOR ART)

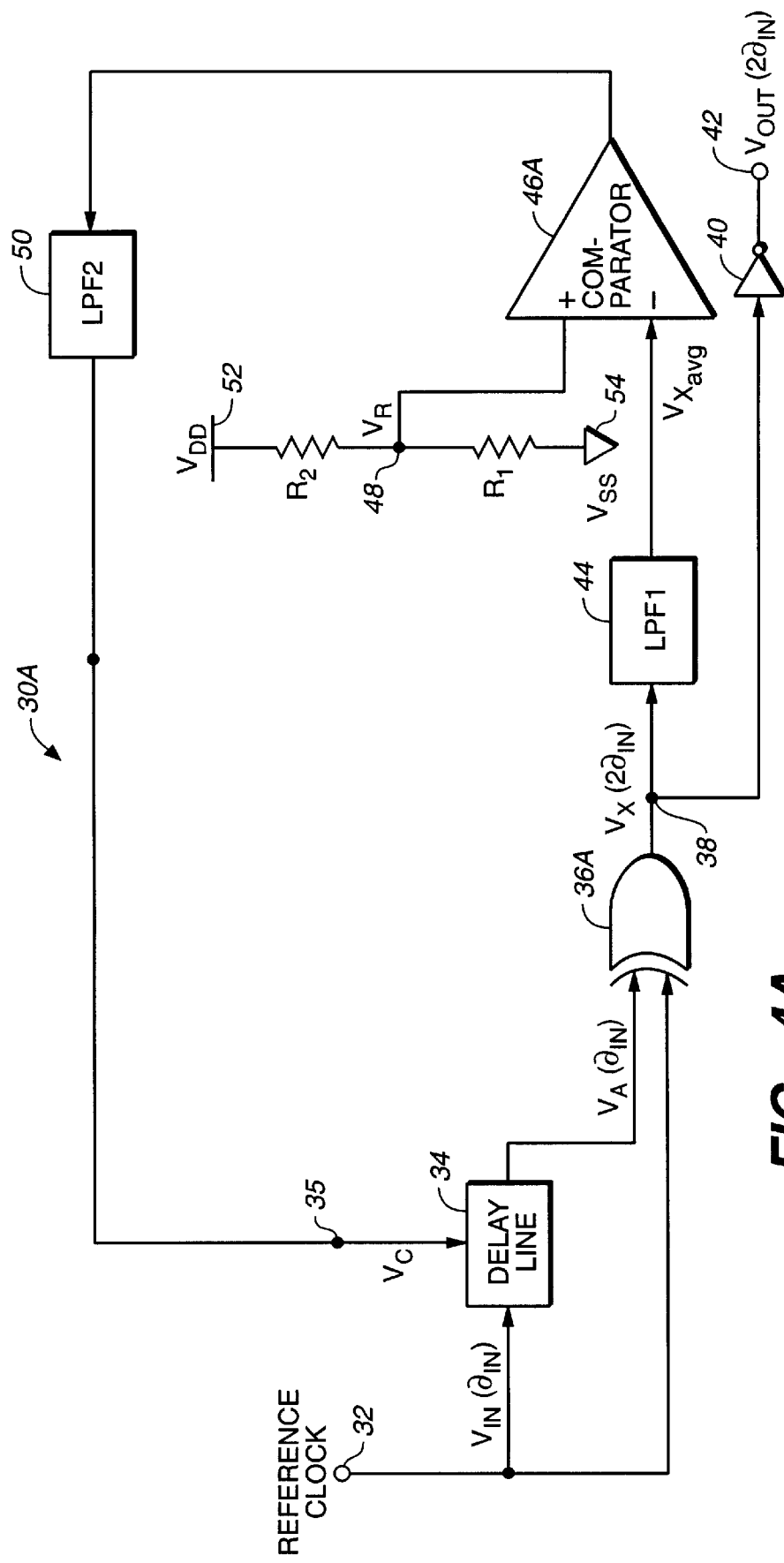
FIG._4A

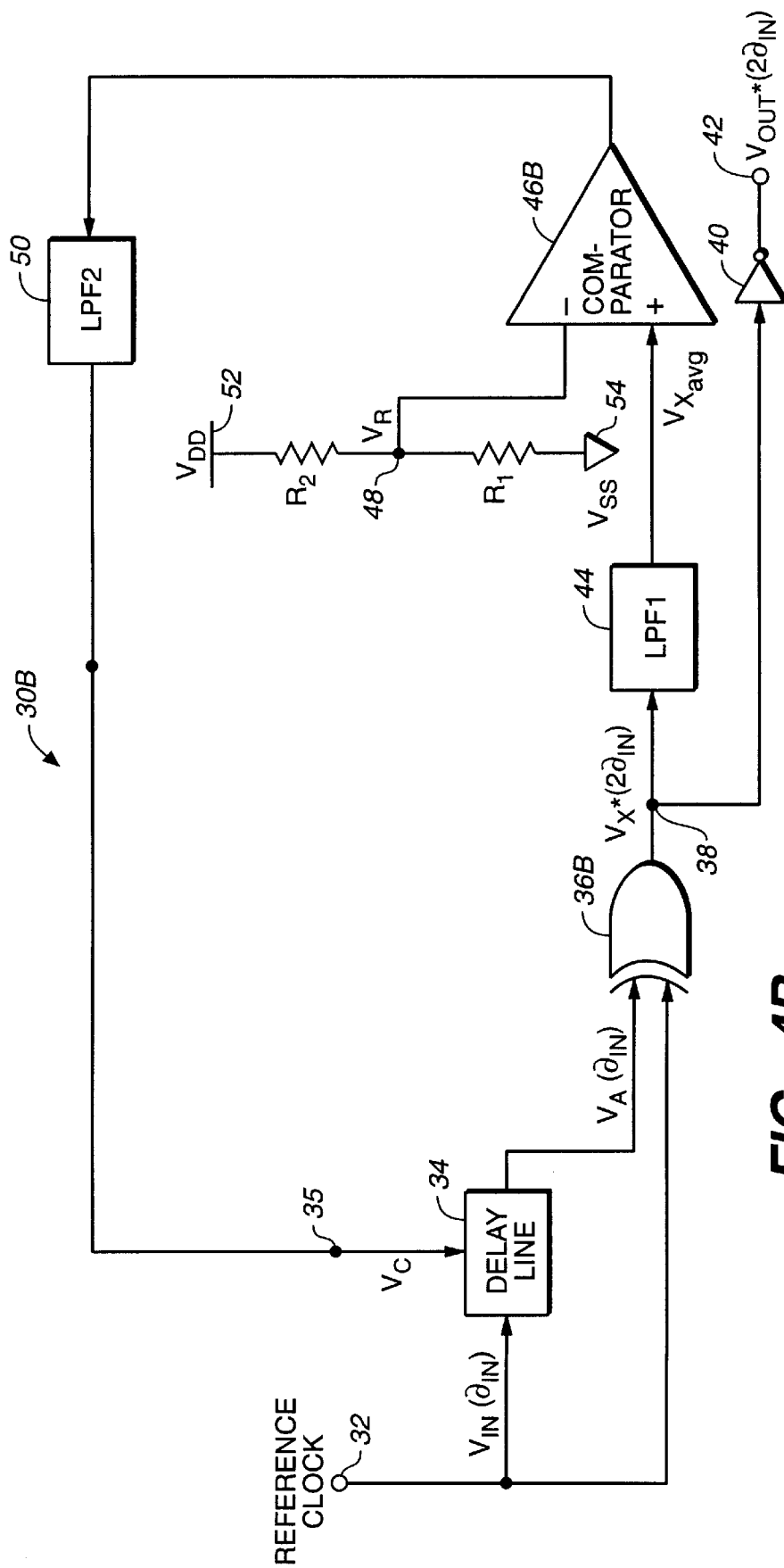
FIG._4B

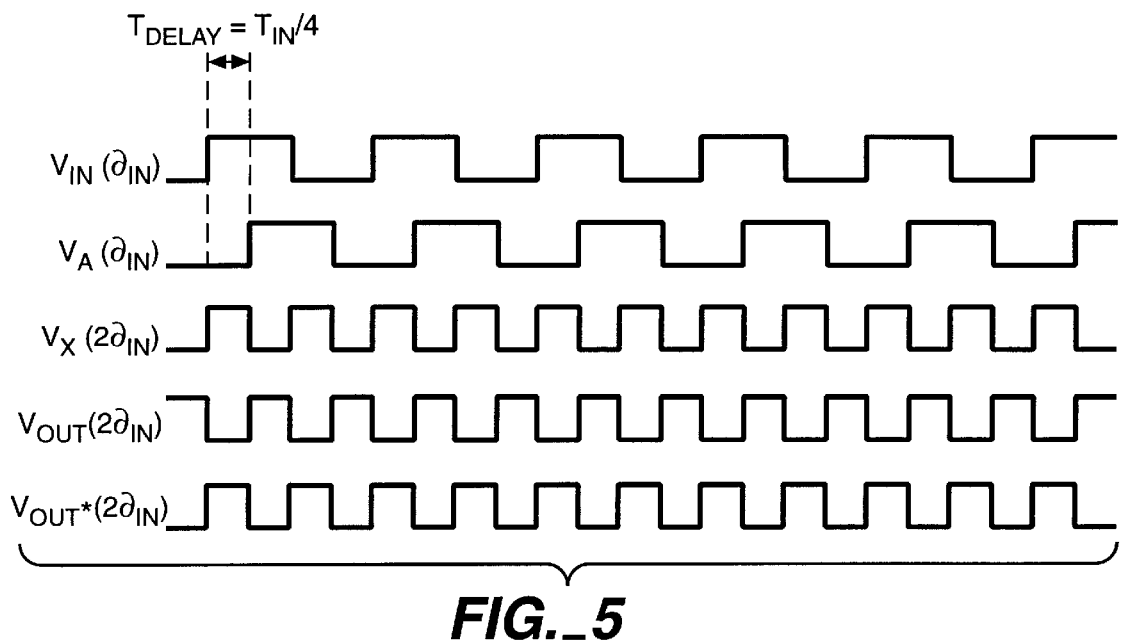
FIG._5
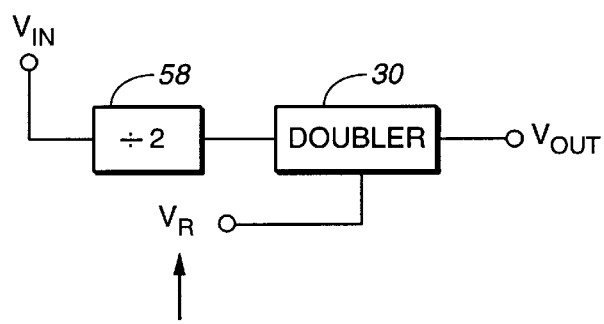
FIG._6
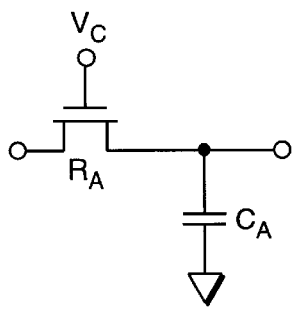
FIG._8A
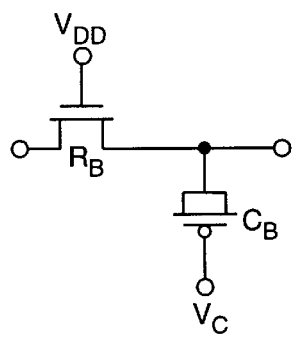
FIG._8B
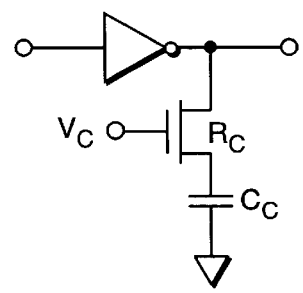
FIG._8C

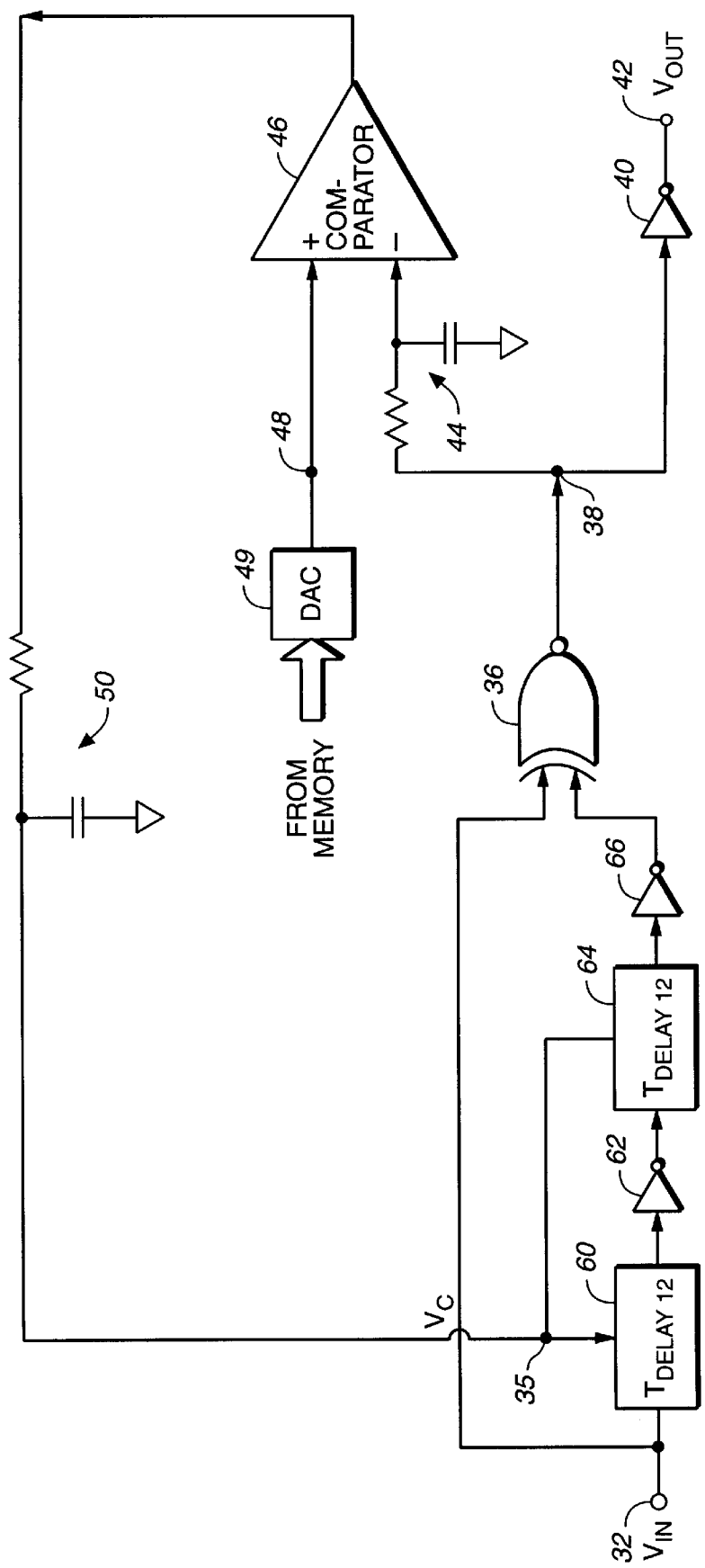
FIG._7

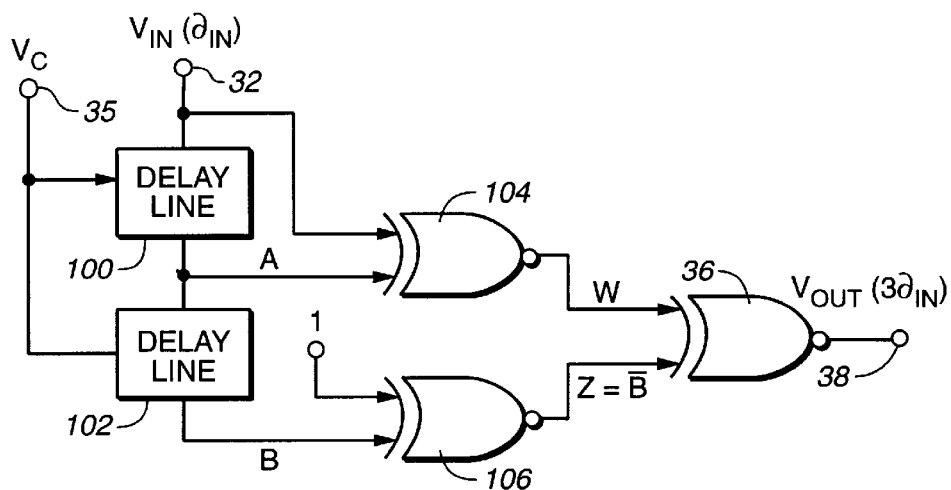
FIG._9
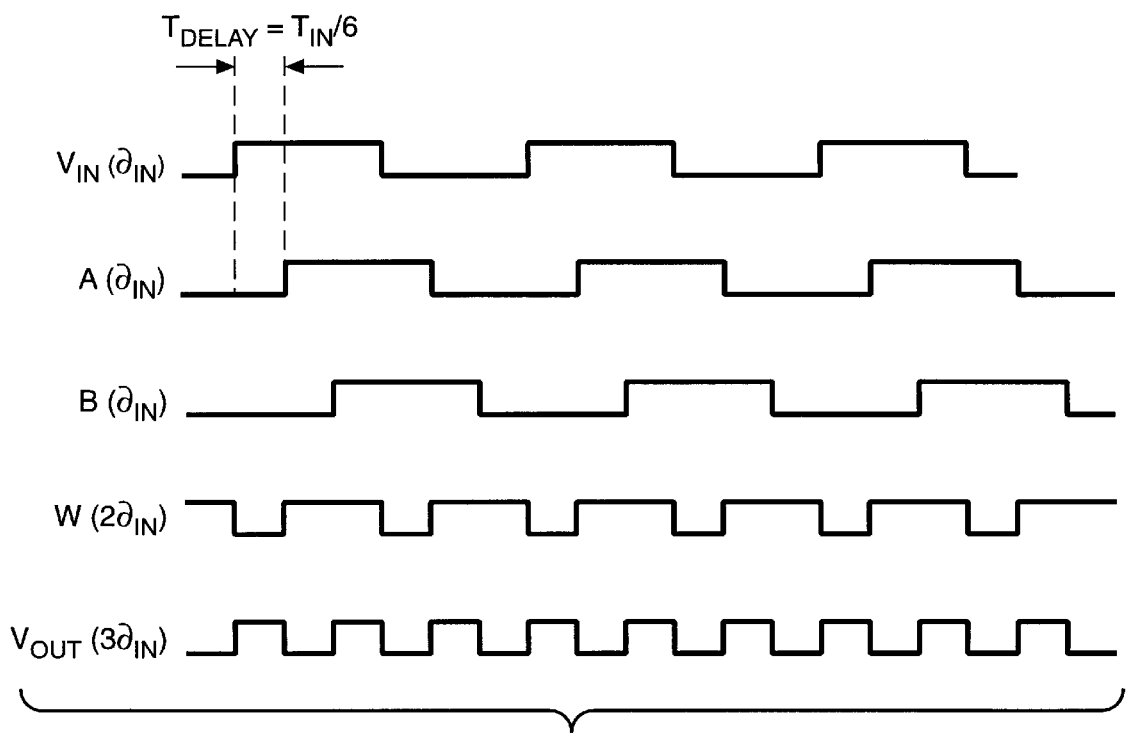
FIG._10

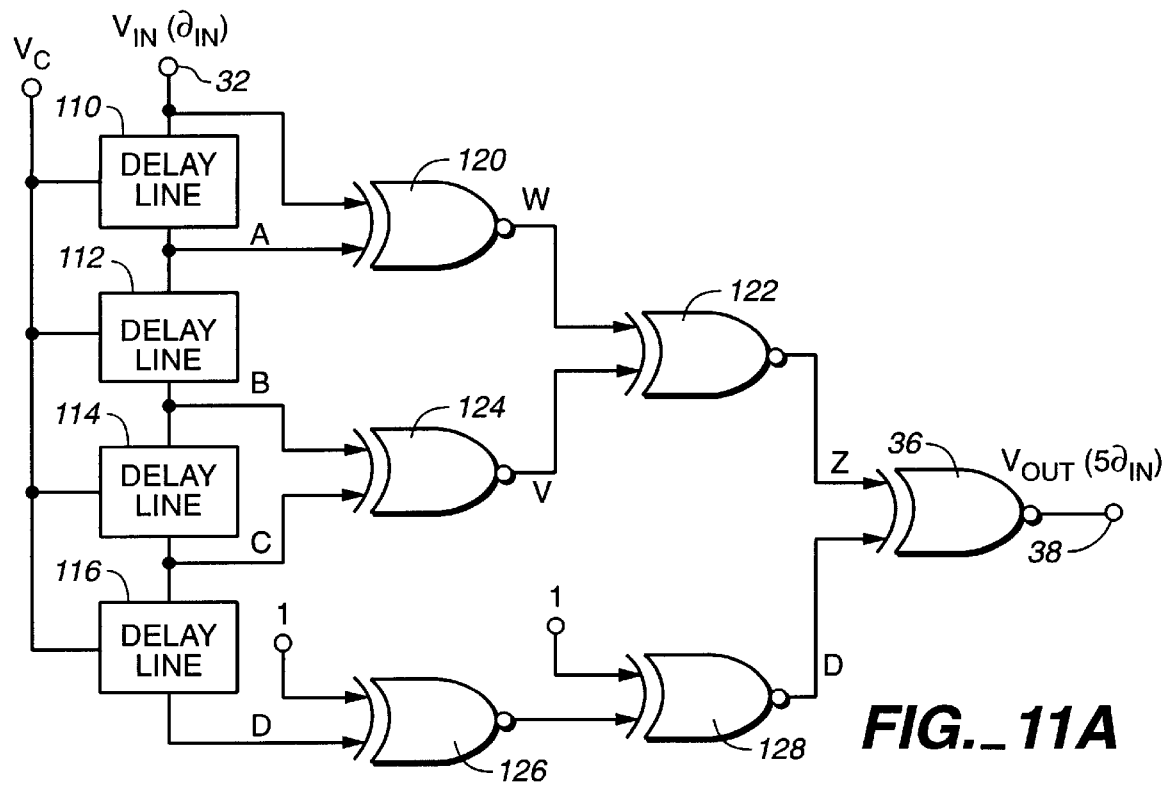
FIG._11A
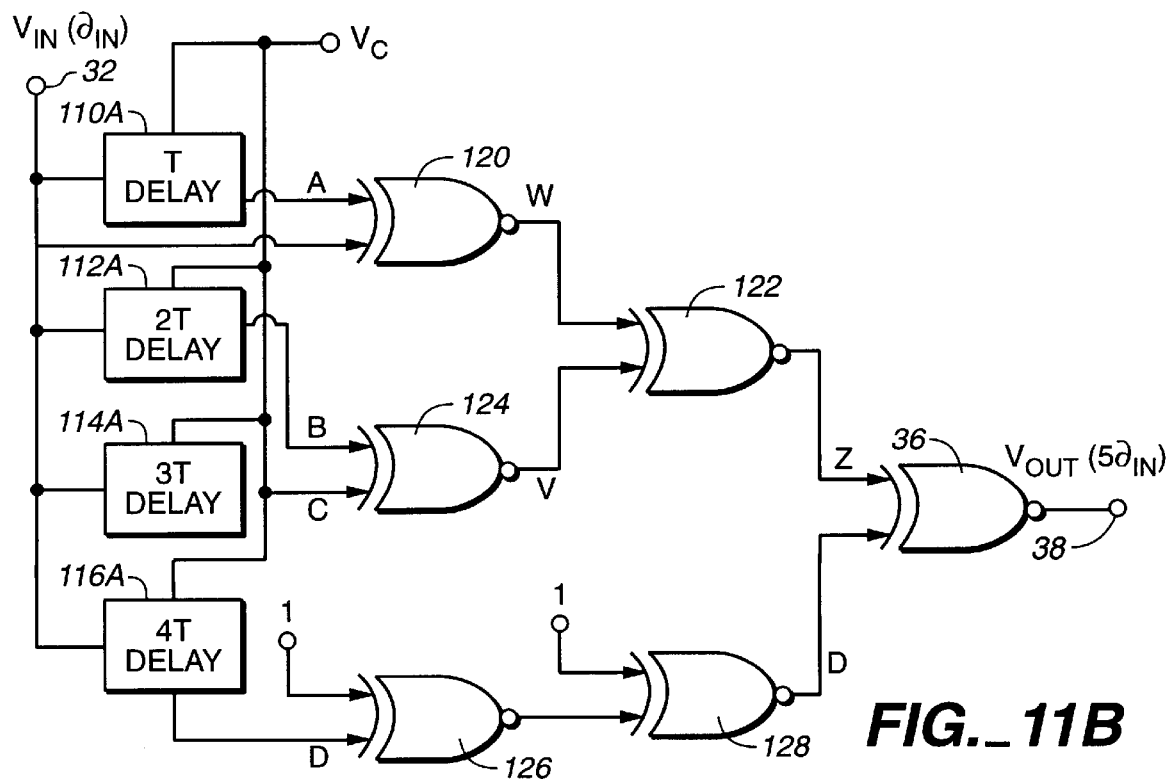
FIG._11B

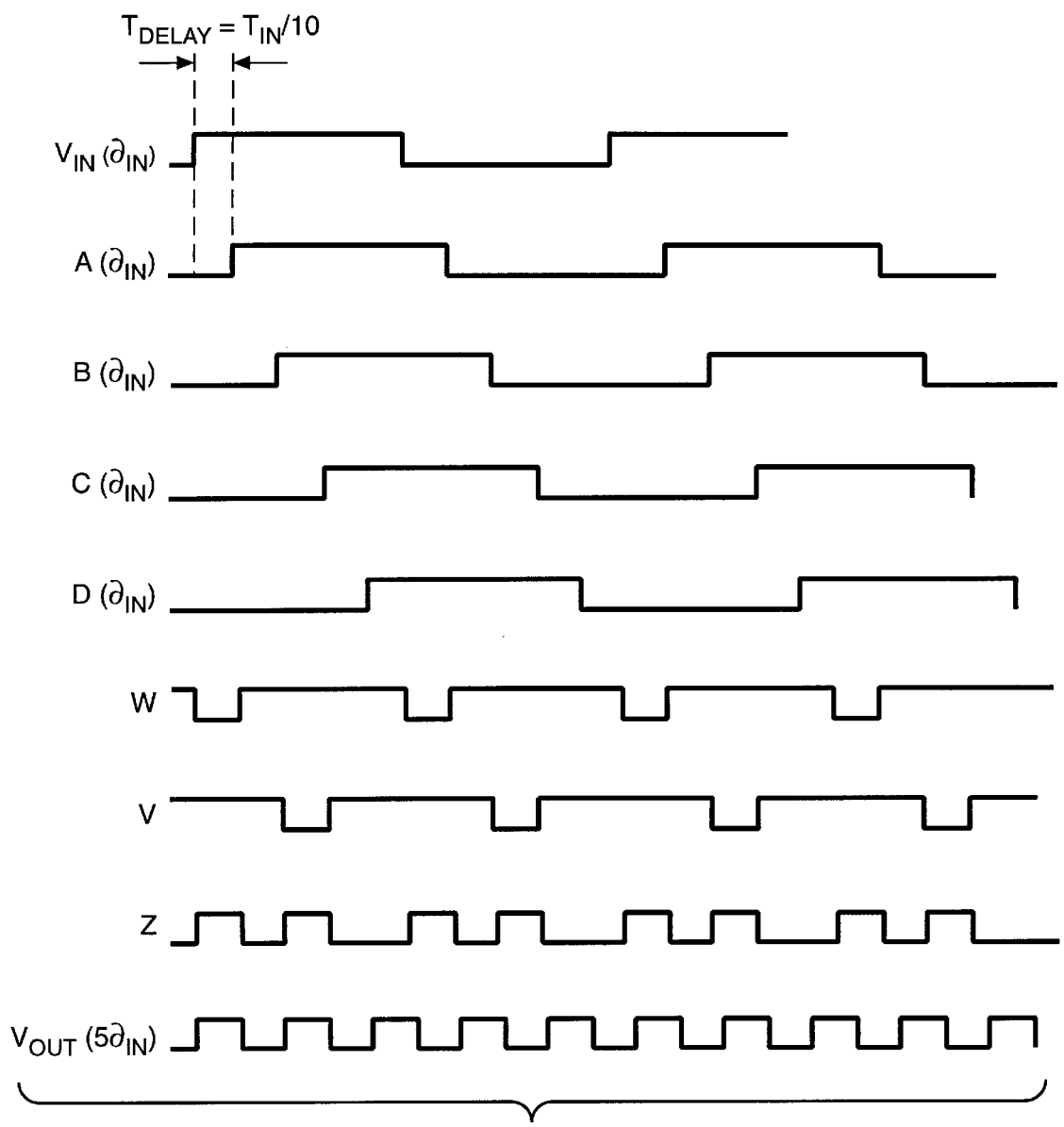
FIG._12

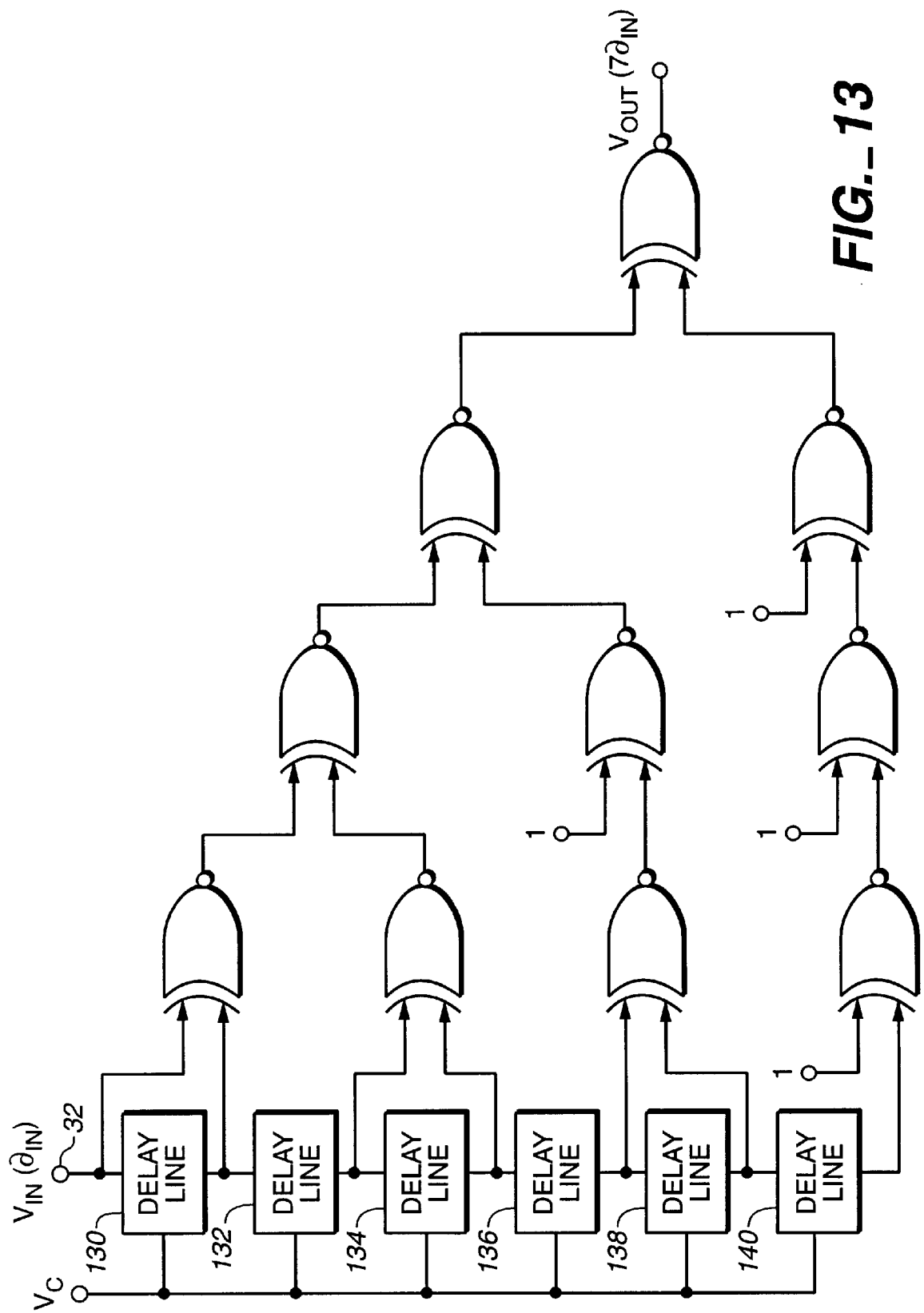
FIG._13

FREQUENCY DOUBLER WITH ADJUSTABLE DUTY CYCLE

BACKGROUND OF THE INVENTION

1. Field of the Invention

This invention relates to frequency doubler and multiplier circuits.

2. Prior Art

Frequency doublers and multiplier circuits are widely employed in integrated-circuit designs to increase the frequency of an off-chip reference clock signal for internal use within the integrated circuit, primarily in application specific integrated-circuits (ASIC) and in microprocessor designs. In general, ASIC's are designed to be scalable such that they can be transferred into a new fabrication process, or technology, with low, or virtually no design and layout modification. The main purpose of having scalable designs is to reduce the so called "time to market window" and to lower product development costs. Thus, embedded frequency doubler modules used in such applications are designed to be insensitive to use in various fabrication process technologies in order to prevent a design bottleneck which might affect fabrication or operation of an entire chip.

Integrated clock signal doublers with reduced sensitivity to fabrication process variations and to temperature fluctuations, with wide power supply voltage and input frequency ranges, i.e., 1.8–6 V and 0.10–50 MHz, have a number of applications in ASIC and microprocessor designs. Yet, in practice, frequency doublers are designed for a particular fabrication process technology with limited input frequency and power supply voltage ranges, i.e., 1–40 MHz and 5 V±10%.

There are two common types of integrated clock doublers: Phase-Locked Loop (PLL) based clock doublers, and delay circuit based clock doublers. A PLL based clock doubler is generally used in high-speed applications that require accurate output clocks.

FIG. 1 shows a block diagram of a typical PLL-based clock doubler system 10, which includes a voltage controlled oscillator (VCO) 12, a charge pump and filter 14, a phase-frequency detector 16, and a frequency divider 18 connected as shown in the Figure. Typically, a PLL is operated at twice the needed frequency and its output is divided by two to produce a 50 percent duty cycle clock signal at the expense of additional die size and power loss. However, this approach is seldom used in high-speed PLL designs with VCOs operating at greater than 300 MHz due to fabrication process bandwidth limitations.

The main drawbacks of PLL based doublers are their sensitivity to power supply and fabrication process variations. Oftentimes, the PLL must be completely redesigned, or extensively modified, when the fabrication technology or the power supply voltage is changed. Thus, the circuit may not be easily scaled from an existing fabrication process into a new process technology or even operated with a new power supply voltage in the same fabrication process.

FIG. 2 shows a delay-line based clock doubler system 20 which uses a simple Exclusive-Or (XOR) gate 22, or alternatively an Exclusive-Nor (XNOR) gate, with a constant delay circuit, or delay line 24 for doubling the frequency of a clock signal. As shown in FIG. 3, both edges of the input signal $V_{IN}$ are used to trigger the rising (or falling for XNOR) edge of the output clock signal $V_{OUT}$. But, the falling edge of $V_{OUT}$ is triggered by both the rising and falling edges of the output signal $V_A$ of the delay circuit, which is shifted in the time domain by $T_{delay}$ seconds with respect to $V_{IN}$. The value of $T_{delay}$ is nominally set to $T_{delay}=T_{IN}/4$ (where $T_{IN}=1/f_{IN}$) in order to produce an output with 50 percent duty cycle.

Note that XOR gate 22 can be replaced by a XNOR gate 22A, if the output signal of the delay line 24 is inverted ($V^*_A f_{IN}$), the output of the XNOR gate is $V_{OUT}^*(2\,f_{IN})$, where * designates an inverted signal.

Delay circuits are sensitive to temperature and fabrication process variations and are also heavily influenced by power supply voltage levels. If $V_{IN}$ has less than 50 percent duty cycle, then any change in $T_{delay}$ will produce frequency distortions for $V_{OUT}$. But, if the duty cycle of $V_{IN}$ is fixed at 50 percent, then delay modulation will only cause duty cycle distortion for $V_{OUT}$. Therefore, any variation in $T_{delay}$ can cause either duty cycle or frequency distortion for $V_{OUT}$.

The performance of a delay based doubler can be improved by compensating for the effects of process, temperature, and power supply voltage. However, each of these variables is typically corrected separately from each other, which requires multiple correction circuits to rectify all inaccuracies. The penalty for obtaining these corrections is additional design complexity, as well as increased die size and increased power losses. Furthermore, the input frequency must be held constant in order to produce an output clock with a defined duty cycle. Any change in $f_{IN}$ requires that the delay circuit be redesigned to maintain the desired duty cycle, unless duty cycle variations can be tolerated. The circuit fails to operate when $T_{IN}<2T_{delay}$ ($f_{IN}>1/2T_{delay}$). Hence, these doublers are not appropriate for any chip with variable input frequency clocks and tight duty-cycle requirements.

Consequently, a need exists for a frequency doubler or multiplier which has reduced sensitivity to fabrication processes and to temperature fluctuations and which can tolerate wide variations in power supply voltage levels and has a wide input frequency range.

SUMMARY OF THE INVENTION

It is therefore an object of the invention to provide an adjustable duty cycle circuit and a frequency doubler or multiplier which has reduced sensitivity to fabrication processes and to temperature fluctuations and which can tolerate wide variations in power supply voltage levels with a wide input frequency range.

In accordance with this and other objects of the invention, an output signal is provided with an adjustable duty cycle at the same frequency as a reference input signal, at twice the same frequency, or at N times the same frequency. A reference-clock input terminal receives an input signal at a reference frequency $f_{IN}$ with a 50 percent duty cycle. If the input signal is initially divided by two, a circuit is then provided which has only an adjustable duty cycle. A logical combining circuit combines the reference input signal with a delayed reference input signal. The delayed reference input signal is provided, for example, with a variable delay circuit having a control terminal for receiving a control signal $V_C$ for controlling the amount of delay through the variable delay circuit. The logical combining circuit includes, for example, an EXCLUSIVE-OR or EXCLUSIVE-NOR logic circuit having a first input terminal coupled to the output terminal of the variable delay circuit, a second input terminal coupled to the reference-clock input terminal, and an output terminal for providing an output signal $V_X$ at a frequency $f_{IN}$ or $2\,f_{IN}$, and with an adjustable duty cycle. A control signal generator having an input terminal coupled to the output terminal of the EXCLUSIVE-OR logic circuit and an output terminal for providing the control signal $V_C$. One embodiment of the control signal generator includes a first low-pass filter (LPF1), a comparator, and a second low-pass filter. The first low pass filter has an input terminal coupled to the output terminal of the EXCLUSIVE-OR logic circuit and an output terminal. The comparator has one input terminal coupled to a voltage reference source and a second input terminal coupled to the output terminal of the first low-pass filter (LPF1). The second low-pass filter (LPF2) has an input terminal coupled to the output terminal of the comparator and has an output terminal at which is provided the control signal for controlling the amount of delay through the variable delay circuit.

The reference voltage determines the duty cycle of the output signal. If the reference input signal is divided by two, the output frequency is the same as the reference input frequency $f_{IN}$ so that the duty cycle of the output signal can be controlled by the reference voltage $V_R$.

One embodiment of the reference voltage source includes a voltage divider having a first resistor R1 with one end coupled to a VDD terminal and the other end coupled to a voltage-divider output terminal. A second resistor R2 has one end coupled to the VSS terminal and the other end coupled to the voltage-divider output terminal. The voltage-divider output terminal is coupled to the second input terminal of the comparator such that the ratio of the voltage divider determines the duty cycle of the output signal.

Another embodiment of the reference voltage source includes a digital-to-analog converter (DAC) having digital inputs from a memory such as a RAM or ROM, or any other reference voltage generator, internal or external to chip. Using a DAC may eliminate the power supply correction ability unless the DAC output is linearly related to the power supply.

A frequency multiplier with an output frequency of N times the frequency of the reference input signal (where N is an odd integer) is obtained with a plurality of N−1 adjustable delay lines and appropriate logical combining circuits.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 1 is a block diagram of a typical Phase-Locked Loop (PLL) based clock doubler.

FIG. 2 is a block diagram of a delay based clock doubler.

FIG. 3 is a timing chart showing signal waveforms in a fixed-delay based clock doubler.

FIG. 4A is a block diagram of a frequency doubler using an XOR gate according to the present invention.

FIG. 4B is a block diagram of a frequency doubler using an XNOR gate according to the present invention.

FIG. 5 is a timing chart showing signal waveforms at several nodes of the frequency doublers of FIGS. 4A–B with a variable pulse width according to the present invention.

FIG. 6 is a block diagram illustrating a circuit for adjusting the duty cycle of an input signal.

FIG. 7 is a block diagram of a frequency doubler which uses a two-section delay circuit, or delay line, to provide equal delays for both rise and fall times and which use a DAC to provide a reference voltage.

FIGS. 8A–C are circuit diagrams for several designs of the components of a variable delay circuit.

FIG. 9 is a block diagram of variable delay circuits and logic circuits for a frequency multiplier with N=3.

FIG. 10 is a timing chart showing signal waveforms at several nodes of the frequency multiplier of FIG. 9.

FIGS. 11A–B are block diagrams of the embodiments of variable delay circuit and logic circuits for a frequency multiplier with N=5.

FIG. 12 is a timing chart showing signal waveforms at several nodes of the frequency multipliers of FIGS. 11A–B.

FIG. 13 is a block diagram of variable delay circuit and logic circuits for a frequency multiplier with N=7.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

FIG. 4A shows a block diagram of a clock doubler 30A with an adjustable duty cycle according to the present invention. The clock doubler 30A provides substantially the same duty cycle over a range of frequencies. A reference clock input terminal 32 receives an input signal $V_{IN}$ at a reference frequency $f_{IN}$ and with a 50 percent duty cycle. A variable delay circuit or delay line 34 has an input terminal connected to the reference clock input terminal, a control terminal 35 for receiving a control voltage signal $V_C$, and an output terminal for providing a voltage $V_A$ at the frequency $f_{IN}$. A two-input EXCLUSIVE-OR circuit 36A has a first input terminal connected to the output terminal of the variable delay circuit 34, a second input terminal connected to the reference clock input terminal 32, and an output terminal 38 at which is provided a voltage signal $V_X$ at a frequency $2 f_{IN}$ at twice the input frequency $f_{IN}$. The output terminal 38 of the EXCLUSIVE-OR circuit 36A is coupled through an inverter buffer 40 to an output terminal 42 at which is provided an output voltage signal $V_{OUT}$ at a frequency $2 f_{IN}$.

A control signal generator includes a first low-pass filter (LPF1) 44, a comparator 46A, a reference terminal 48, and a second low-pass filter (LPF2) 50. An input terminal of the control signal generator is connected to the terminal 38 for receiving the $V_X$ signal. An output terminal of the control signal generator provides the control voltage signal $V_C$ to the control voltage terminal 35 of the variable delay circuit 34.

The first low-pass filter (LPF1) 44 has an input terminal connected to terminal 38 and has an output terminal. A voltage comparator 46A has a negative reference input terminal, a positive reference input terminal, and an output terminal. The negative reference input terminal is connected to $V_{Xavg}$ at the output terminal of the first low-pass filter (LPF1) 44. The positive reference input terminal of the comparator 46A is connected to the reference-voltage node 48 of a voltage divider. The voltage divider includes a first resistor $R_1$ and a second resistor $R_2$ which provide a reference voltage $V_R$ at the reference-voltage node 48. The first resistor $R_1$ has one end coupled to a $V_{DD}$ voltage terminal 52 and the other end coupled to the reference-voltage node 48. The second resistor R2 has one end coupled to a VSS voltage terminal 54 and the other end coupled to the reference-voltage node 48. The voltage ratio of the voltage divider provides the reference voltage $V_R$. It will be seen that $V_R$ determines the duty cycle of the output signal $V_{OUT}$ at terminal 42. The second low-pass filter (LPF2) 50 has an input terminal coupled to the output terminal of the comparator 46 and an output terminal connected to the reference clock input terminal 35 of the variable delay circuit 34.

The adjustable delay circuit or delay line 34 is used to create the phase shift needed to delay the input signal, where the amount of delay is set by the control signal $V_C$. Assuming rail-to-rail voltage swings for $V_X$ between $V_{DD}$ and VSS and assuming equal rise and fall times for $V_X$, the average (DC) value at the input of the voltage comparator 46 can be obtained from $$V_{Xavg} = (V_{DD}T_{Xup} + V_{SS}T_{Xdn})/T_X \qquad (1),$$

where $T_X$ is the period of $V_X$ ($T_X = 1/2f_{in}$), $T_{Xup}$ and $T_{Xdn}$ are the duration in one cycle for which, respectively, $V_X = V_{DD}$ and $V_X = V_{SS}$. For $V_{SS} = 0$, the value of $V_{Xavg}$ can be approximated by $$V_{Xavg} = (V_{DD}T_{Xup})/T_X \qquad (2),$$

The reference voltage $V_R$ at the positive reference input terminal 48 of the voltage comparator 46 is $$V_R = V_{DD}R_1/(R_1+R_2) \qquad (3),$$

which is used to maintain the value of $V_C$ so that $$V_{Xavg} = V_R \qquad (4).$$

Using equations (1)–(4), the duty cycle of $V_X$ and consequently $V_{OUT}$ can be calculated from $$T_{Xup}/T_X = R_1/(R_1+R_2) \qquad (5),$$

where $T_{Xup}$ is predominantly controlled by the relative values of the resistors $R_1$ and $R_2$ and is independent of the power supply voltage, $V_{DD}$.

In one embodiment of the invention, the −3db corner frequency of LPF2 is set to be more than one order of magnitude lower than the −3 db corner frequency of LPF1 and is optimized for 1 MHz$<f_{in}<$40 MHz such that a 50 percent duty cycle is provided for $V_{OUT}$ with $R_1 = R_2$.

The propagation delay through the delay circuit 34 is controlled by the control voltage $V_C$ according to $$T_{delay} = T_0 + T(V_C) \qquad (6),$$

where $T_0$ is the minimum delay when $V_C = 0$, $V_C$ is measured from $V_{DD}$ and $T(V_C)$ is provided as typically described in the IEEE Journal of Solid-State Circuits, Vol. 31, No. 7, article entitled "A Low-Voltage, Low-Power CMOS Delay Element," by Kim, Gyudong et al., July, 1996, pp. 966–971. In the steady state condition, when $f_{OUT} = 2f_{in}$, $T_{delay}$ must be $$T_{delay} = T_{in}/4 \qquad (7),$$

where $T_{in} = 1/f_{in}$. Now, if $T_{delay} > T_0$, then the control voltage $V_C > 0$. The value of $V_C$ is zero only when $T_{delay} = T_0$. Therefore, a limited amount of difference in voltage $\Delta V$ between $V_R$ and $V_{Xavg}$, where $\Delta V = V_R - V_{Xavg}$, is always required in order to keep $V_C > 0$. The value of $\Delta V$ is inversely related to the sensitivity, or directly to the voltage gain, of the voltage comparator 46. A lower value of sensitivity or an increased value of voltage gain for the voltage comparator 46 would reduce the value of $\Delta V$.

The falling edge of $V_{OUT}$ is triggered by both the rising and falling edges of $V_{IN}$, while the rising edge of $V_{OUT}$ is triggered by both edges of $V_A$. Thus, if $V_{IN}$ has a 50 percent duty cycle, then the falling edge of $V_{OUT}$ is fixed in time and its rising edge will be modulated by fluctuation in $T_{delay}$.

FIG. 4B shows a block diagram of a XNOR clock doubler 30B with an adjustable duty cycle according to the present invention. The clock doubler 30B provides substantially the same duty cycle over a range of frequencies. The reference clock input terminal 32 receives an input signal $V_{IN}$ at a reference frequency $f_{IN}$ and with a 50 percent duty cycle. The variable delay circuit 34 has an input terminal connected to the reference clock input terminal, the control terminal 35 for receiving a control voltage signal $V_C$, and an output terminal for providing the voltage $V_A$ at the frequency $f_{IN}$. A two-input EXCLUSIVE-NOR circuit 36B has a first input terminal connected to the output terminal of the variable delay circuit 34, a second input terminal connected to the reference clock input terminal 32, and an output terminal 38 at which is provided a voltage signal $V^*_X$ at a frequency $2f_{IN}$ at twice the input frequency $f_{IN}$. The output terminal 38 of the EXCLUSIVE-NOR circuit 36B is coupled through the inverter buffer 40 to the output terminal 42 at which is provided an output voltage signal $V_{OUT}^*$ at a frequency $2f_{IN}$.

The control signal generator includes the first low-pass filter (LPF1) 44, a voltage comparator 46, the reference terminal 48, and the second low-pass filter (LPF2) 50. An input terminal of the control signal generator is connected to the terminal 38 for receiving the $V^*_X$ signal. An output terminal of the control signal generator provides the control voltage signal $V_C$ to the control voltage terminal 35 of the variable delay circuit 34.

The first low-pass filter (LPF1) 44 has an input terminal connected to terminal 38 and has an output terminal. The voltage comparator 46B has a negative reference input terminal, a positive reference input terminal, and an output terminal. The positive reference input terminal is connected to $V_{Xavg}$ at the output terminal of the first low-pass filter (LPF1) 44. The negative reference input terminal of the comparator 46 is connected to the reference-voltage node 48 of the voltage divider. The voltage divider includes the first resistor $R_1$ and the second resistor $R_2$ which provide the reference voltage $V_R$ at the reference-voltage node 48. The first resistor $R_1$ has one end coupled to the $V_{DD}$ voltage terminal 52 and the other end coupled to the reference-voltage node 48. The second resistor $R_2$ has one end coupled to the VSS voltage terminal 54 and the other end coupled to the reference-voltage node 48. The voltage ratio of the voltage divider provides the reference voltage $V_R$. It will be seen that $V_R$ determines the duty cycle of the output signal $V_{OUT}^*$ at terminal 42. The second low-pass filter (LPF2) 50 has an input terminal coupled to the output terminal of the comparator 46 and an output terminal connected to the reference clock input terminal 35 of the variable delay circuit 34.

The adjustable delay circuit 36 is used to create the phase shift needed to delay the input signal, where the amount of delay is set by the control signal $V_C$. The relationships of equations (1) through (7) of FIG. 4A also hold for the embodiment of FIG. 4B.

FIG. 5 shows signal waveforms of $V_{IN}$ at terminal 32, $V_A$ at one input terminal to the EXCLUSIVE_OR circuit 36, and $V_X$ at the output terminal 38 of the comparator 36. Increasing the delay time of the delay circuit 34 is accomplished by increasing the reference voltage $V_R$ at terminal 48. This will increase the up-time and the duty cycle of $V_X$ so that $V_{Xavg}$ is also increased. The delay time of the delay circuit 34 is reduced by reducing the reference voltage $V_R$. This decreases the duty cycle of $V_X$ so that $V_{Xavg}$ is decreased.

Note that value of $T_{delay}$ is controlled by $V_C$, which is ultimately regulated by $\Delta V$. Peak-to-peak variations of the rising edge of $V_X$ were predicted through a simulation. However, it should be clear that $V_{Xavg}$ would modulate around $V_R$, independent of the value set for $V_R$. But, the amount of its modulation can be reduced through increasing the sensitivity, or voltage gain, of the voltage comparator.

A principle advantage of the invention is its capability to compensate for any temperature, process, or power supply voltage variations using the feedback loop provided by LPF1, the comparator 46, and LPF2 to keep $V_{Xavg}=V_R$. The highest value for $f_{IN}$ to hold $V_{OUT}$ at a 50 percent duty cycle is set by $T_0$ where $f_{IN,Max} \Delta 1/4T_0$, assuming that the delay through the XOR is negligible. The minimum value of $f_{IN}$, for which a 50 percent duty cycle is maintained, is set by the 3dB corner frequency of LPF1. Below the 3db corner frequency of LPF1, the circuit would still double the frequency of the reference clock, but its duty cycle would not be maintained and can be estimated from $$DTC_{out} \Delta (0.5T_{in}-T_{delayMax})/0.5T_{in} \qquad (8),$$

where $DTC_{OUT}$ is the duty cycle of $V_{OUT}$, and $T_{delayMax}$ is the maximum delay through the delay circuit ($V_C=V_{DD}$). The corner frequency of LPF1 can be reduced to expand the input frequency range at the expense of increased initial settling time and extra die area.

FIG. 6 illustrates a circuit for adjusting the duty cycle of an input signal, $V_{IN}$. The input signal is initially divided by two in a divider 58 and the divided signal is processed by a doubler circuit, such as the circuit 30 of FIGS. 4A–B.

It is important to be aware that this circuit can also be used as a duty cycle adjuster when $f_{IN}$ is divided by two by a DFF or any other circuit. The required duty cycle for $V_{OUT}$ can be set by resistor ratios to keep $f_{OUT}=f_{IN}$ or a DAC. The required duty cycle can also be set by a voltage signal obtained from a digital-to-analog converter DAC which gets its digital input signal from, for example, a ROM or RAM.

One embodiment of a doubler design occupies 100 $\mu$m×500 $\mu$mm of die area in a 0.5 $\mu$m n-well CMOS process and consumes less than 2 mA of current from a single 5V power supply when $f_{IN}$=40 MHz. The design is optimized for 1 MHz<$f_{IN}$<40 MHz so that $V_{OUT}$ maintains a 50 percent duty cycle over 3–6V power supply voltage. The circuit is scalable to any standard CMOS technology to operate with 32 KHz<$f_{IN}$<40 MHz.

A simulation provided results for a doubler operating from a single 5V power supply in the 0.5 $\mu$m process when $f_{IN}$=40 MHz with a 50 percent duty cycle. The simulation depicted peak-to-peak variations of the rising edge of $V_{OUT}$ for these same operating conditions over a 22 $\mu$s period encompassing over 1760 clock cycles at $f_{OUT}$=80 MHz. The total simulated peak-to-peak distortion was about 700 ps. Thus, $f_{OUT}$ has a duty cycle of 50±5.6 percent at 80 MHz. The simulation depicted peak-to-peak modulation of the rising edge of $V_{OUT}$ when the doubler is scaled into a 0.35 $\mu$m n-well process, and is operated from a 3V power supply with $f_{IN}$=40 MHz. The amount of rising edge fluctuation is increased to 1 ns, which increases the duty cycle variation to ±8 percent. For $f_{IN}$=25 MHz, the peak-to-peak modulation increases to 1.3 ns (±5.2 percent) for the 0.35 $\mu$m/3V process.

Sensitivity of the voltage comparator is reduced when power supply voltage is lowered. Thus, to maintain $V_R=V_{avg}$, the required $\Delta V$ is increased. Consequently, $V_C$ fluctuations are magnified, which in turn produces higher duty cycle distortion for the circuit operating at 0.35 $\mu$m/3V simulation case than in the 0.5 $\mu$m/5V case. As the power supply voltage is reduced, the range of input frequency is typically lowered for the entire chip.

The integrated-circuit clock doubler can use standard CMOS technology. The circuit regulates the duty cycle of the created clock through a negative feedback scheme that substantially eliminates influence of process, temperature and power supply voltage on the output clock. Furthermore, the input frequency range is wider than a traditional PLL and a delay based doubler with a lower integrated-circuit die size and lower power consumption than the PLL based designs while providing higher precision than the delay based techniques. The circuit is scalable to any standard CMOS process without significant design or layout changes.

In one embodiment of the invention scalability was chosen as a primary design requirement. The power supply voltage range was between 2.7V to 6V with an input frequency range of 32 KHz to 40 MHz. The duty cycle of the generated output clock was set to 50 percent, especially for $f_{IN}$>10 MHz over an entire temperature range of 0° C. to 135° C. The initial design was implemented in a 0.5 $\mu$m n-well single poly standard CMOS process with $T_{ox}$=137 Å.

FIG. 7 illustrates a frequency doubler which is similar to the doubler of FIG. 4A, which uses the same reference numerals for the same circuit elements. The reference voltage $V_R$ at terminal 48 is provided by a DAC controller 49 by digital input signals from, for example, a RAM or ROM.

A delay circuit for the frequency doubler is provided by two variable delay circuit units, each providing one-half of the required delay. A first variable delay circuit or delay line unit 60 has an input terminal coupled to the input terminal 32 and an output terminal coupled to an input terminal of a first inverter 62. The output terminal of the first inverter 62 is coupled to an input terminal of a second variable delay unit 64. The output terminal of the second variable delay unit 64 is coupled to an input terminal of a second inverter 66. The output terminal of the second inverter 66 is coupled to an input terminal of the comparator 36. The first and second low-pass filters are illustrated as R-C filter sections. Similar variable delay circuits are also used with the XNOR frequency doubler of FIG. 4B.

The two buffered variable delay circuits 60, 64 are used to provide equal delay times for both rise times and fall times.

FIGS. 8A–C illustrate various circuits for implementation of a variable RC delay circuit unit, the delay of which is controlled by the control voltage $V_C$. Either the resistance R or the capacitance C can be fixed or variable, or both can be variable. A MOS n-channel or p-channel device can be used as a variable R or C device. FIG. 8A shows a fixed shunt capacitor $C_A$ and a series variable-resistance n-channel transistor controlled by $V_C$. FIG. 8B shows a series fixed-resistance n-channel transistor $R_B$ and a shunt variable-capacitance shunt p-channel transistor $C_B$ controlled by $V_C$. FIG. 8C shows a series buffer inverter with its output terminal shunted by the series combination of a fixed capacitor $C_C$ in series with a variable-resistance n-channel transistor $R_C$ controlled by $V_C$. The low-pass filter can be provided by other filtering techniques, including operational amplifiers, switched-capacitor, or any other active filter design technique, as required.

FIG. 9 illustrates a variable delay circuit and logic circuit for producing a $V_X$ (3 $f_{IN}$) signal which has a frequency three times the $f_{IN}$ when the circuit shown in FIG. 9 replaces the single variable delay circuit 34 of FIGS. 4A and 4B with two delays to provide a frequency tripler. The necessary delays are split between two delay circuits or delay lines 100, 102.

The delay circuit 100 has its delay controlled by $V_C$ at terminal 35 and has an input terminal coupled to the reference input terminal 32. An output signal A at the output terminal of the variable delay circuit 100 is coupled to one input terminal of an EXCLUSIVE_NOR gate 104. The other input terminal of the EXCLUSIVE_NOR gate 104 is coupled to the reference input terminal 32. An output signal W of the EXCLUSIVE_NOR gate 104 is coupled to one input terminal of the EXCLUSIVE_NOR gate 36.

The delay circuit 102 has its delay controlled by $V_C$ also from terminal 35 and has an input terminal of the variable delay circuit 102 is coupled to the output signal A from the variable delay circuit 100. An output signal B at the output terminal of the variable delay circuit 102 is coupled to one input terminal of an EXCLUSIVE_NOR gate 106. The other input terminal of the EXCLUSIVE_NOR gate 106 is held at a ONE level. An output signal Z of the gate 106 is an inverted B signal and is coupled to the other input terminal of the EXCLUSIVE_OR gate 36. The output signal of gate 36 is at three times this input reference frequency.

Note that the delay for signal B can also be obtained by using two series delay circuits from terminal 32.

FIG. 10 is a timing chart illustrating the waveforms for the signals $V_{IN}$, A, B, W and $V_{OUT}$ (3 $f_{IN}$). As illustrated, the time delays of the variable delay circuits 100, 102 are set to one-sixth of the reference signal period. Note that the delay for signal B can be optimally provided by delaying the input reference signal at terminal 32 using two delay circuits in series from terminal 32.

FIG. 11A illustrates a variable delay circuit, or delay line, and logic circuit for producing a $V_X$ (5 $f_{IN}$) signal with a frequency five times $f_{IN}$ when the circuit of FIG. 11A replaces the variable delay circuit, or delay line, of FIGS. 4A–B to provide a frequency quintupler. The necessary delays are split between four delay circuits 110, 112, 114, 116, all of which are controlled by the control signal $V_C$.

The variable delay circuit 110 has an input terminal coupled to the reference input terminal 32. An output signal A is coupled to one input terminal of an EXCLUSIVE_NOR gate 120. The other input terminal of the gate 120 is coupled to the reference input terminal 32. An output signal W of the gate 120 is coupled to one input terminal of an EXCLUSIVE_NOR gate 122.

An input terminal of the variable delay circuit, or delay line, 112 receives the signal A. An output signal B from the variable delay circuit 112 is coupled to one input terminal of an EXCLUSIVE_NOR gate 124. The output signal B from the variable delay circuit 112 is coupled to one input terminal of an EXCLUSIVE_NOR gate 124. The output signal B is also coupled to an input terminal of the variable delay circuit, or delay line, 114, the output signal C of which is coupled to the other input terminal of an EXCLUSIVE_NOR gate 124. The gate 124 has an output signal V which is provided at the other input terminal of gate 122. Gate 122 has an output signal Z which is provided to one input terminal of the EXCLUSIVE_NOR gate 36.

Signal C is provided to the input terminal of variable delay circuit, or delay line, 116 to provide a signal D at an input terminal of an EXCLUSIVE_NOR gate 126, the other input terminal of which is held at a ONE level. The output signal of gate 126 is coupled to one input terminal of an EXCLUSIVE_NOR gate 128, the other input terminal of which is held at a ONE level. An output signal D of the gate 128 is applied to the other input terminal of the EXCLUSIVE_NOR gate 36.

FIG. 11B illustrates using separate delays from terminal 32 using a variable delay circuit 110A with a single unit delay, a variable delay circuit 112A with two unit delays, a variable delay circuit 114A with three unit delays, and a variable delay circuit 116A with four unit delays.

FIG. 12 is a timing chart illustrating the waveforms for the signals $V_{IN}$, A, B, C, D, W, V, Z and $V_{OUT}$ (5 $f_{IN}$). As illustrated, the delay of time variable delay circuits 110, 112, 114, 116 are set to one-tenth of the referenced signal period. The various delays can be optimally provided by various combinations of variable delay circuits to create signals B, C, D.

Note that the duty cycle of the output signals can be controlled not only using a reference control resistor divider, but also from a DAC coupled with an external memory for a duty cycle adjuster and from any suitable static or adjustable DC voltage source. It is also noted again that the circuit disclosed herein can be used as a duty cycle adjuster when the input signal is initially divided by two.

The approach for obtaining frequency multiplication with N=3, 5, 7 . . . or any odd integer is first to create signal transitions, as in the doubler configuration and to then adjust the delays so that the duty cycle of the output signal is controlled according to the voltage provided by the resistor divider or other DC source.

FIG. 13 illustrates a variable delay circuit or delay line and logic circuit for producing a $V_X$ (7 $f_{IN}$) signal with a frequency seven times $f_{IN}$ using the scheme of FIG. 11A. The necessary delays are split between six delay circuits 130, 132, 134, 136, 138, 140, all of which are controlled by the control signal $V_C$ and which have delays which progressively increase by unit delay.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

I claim:

1. A duty cycle adjustment circuit for adjusting the duty cycle of a reference input signal, comprising:

a reference-clock input terminal for receiving the reference input signal at a reference frequency $f_{IN}$ and with a 50 percent duty cycle;

a divide-by-two circuit having an input terminal coupled to the reference-clock input terminal and having an output terminal at which is provided a divided reference input signal;

a variable delay circuit for providing a variable delay to the divided reference input signal, wherein the variable delay circuit has an input terminal for receiving the divided reference input signal, an output terminal, and a control terminal for receiving a control signal for controlling the amount of delay through the variable delay circuit;

a combining circuit using exclusive logic for logically combining the divided reference input signal with the delayed divided reference input signal to provide an output signal at an output terminal wherein the frequency of the output signal is at twice the frequency of the divided reference input signal and the same frequency as the reference input signal;

a control signal generator circuit having an input terminal coupled to the output terminal of the combining circuit through an average-value circuit, having another input terminal coupled to a DC reference voltage from a DC reference source, and having an output terminal coupled to the control terminal of the variable delay circuit, wherein the control signal generator compares the average value of the output signal at twice the frequency of the divided reference input signal to the DC reference voltage to provide the control signal for controlling the amount of delay through the variable delay circuit wherein the duty cycle of the output signal, which is at the same frequency as the reference input signal, is determined by the DC reference voltage.

2. The duty cycle adjustment circuit of claim 1, wherein the control signal generator includes a first low-pass filter having an input terminal coupled to the output terminal of the combining circuit and having an output terminal; and wherein the control signal generator includes a comparator having one input terminal coupled to the DC voltage reference source, having a second input terminal coupled to the output terminal of the first low-pass filter, and having an output terminal.

3. The duty cycle adjustment circuit of claim 2, wherein the control signal generator includes a second low-pass filter having an input terminal coupled to the output terminal of the comparator and having an output terminal at which is provided the control signal for controlling the amount of delay through the adjustable delay circuit.

4. The duty cycle adjustment circuit of claim 1, wherein the combining circuit includes an EXCLUSIVE-OR logic circuit having a first input terminal coupled to the output terminal of the variable delay circuit, a second input terminal for receiving the divided reference input signal, and an output terminal for providing an output signal $V_X$ at a frequency twice the frequency of the divided reference input signal and at the same frequency as the reference input signal and having a duty cycle controlled by the control signal.

5. The duty cycle adjustment circuit of claim 1, wherein the combining circuit includes an EXCLUSIVE-NOR logic circuit having a first input terminal coupled to the output terminal of the variable delay circuit, a second input terminal coupled to the output terminal of the divide-by-two circuit, and an output terminal for providing an output signal $V_X$ at a frequency equal to the frequency of the reference input signal with a duty cycle controlled by the control signal.

6. The duty cycle adjustment circuit of claim 2, wherein the DC reference source includes a voltage divider having a first resistor R1 with one end coupled to a VDD terminal, having a second resistor R2 with one end coupled to a VSS terminal, having a voltage-divider output terminal with the other ends of the first and the second resistors coupled thereto, and having the voltage-divider output terminal coupled to the second input terminal of the comparator, wherein the voltage ratio of the voltage divider determines the duty cycle of the output signal.

7. The duty cycle adjustment circuit of claim 2, wherein the voltage reference source is a digital-to-analog converter.

8. The duty cycle adjustment circuit of claim 7, wherein the input signals to the digital-to-analog converter are from a memory.

9. A frequency doubler with an adjustable duty cycle, comprising:

a reference-clock input terminal for receiving a reference input signal at a reference frequency $f_{IN}$ and with a 50 percent duty cycle;

a variable delay circuit for providing a variable delay to the reference input signal, wherein the variable delay circuit has an input terminal coupled to the reference-clock input terminal, an output terminal, and a control terminal for receiving a control signal for controlling the amount of delay through the variable delay circuit;

a combining circuit using exclusive logic for logically combining the reference input signal with the delayed reference input signal to provide an output signal at an output terminal wherein the frequency of the output signal is at twice the frequency of the reference input signal; and a control signal generator circuit having an input terminal coupled to the output terminal of the combining circuit through an average-value circuit, having another input terminal coupled to a DC reference voltage from a DC reference source, and having an output terminal coupled to the control terminal of the variable delay circuit for the control signal which controls the amount of delay through the adjustable delay circuit, wherein the control signal generator compares the average value of the output signal at twice the frequency of the reference input signal to the DC reference voltage to provide the control signal for controlling the amount of delay through the variable delay circuit and wherein the duty cycle of the output signal is determined by the DC reference voltage.

10. The frequency doubler of claim 9, wherein the control signal generator includes a first low-pass filter having an input terminal coupled to the output terminal of the combining circuit and having an output terminal.

11. The frequency doubler of claim 10, wherein the control signal generator includes a comparator having one input terminal coupled to the DC reference source, having a second input terminal coupled to the output terminal of the first low-pass filter, and having an output terminal.

12. The frequency doubler of claim 11, wherein the control signal generator includes a second low-pass filter having an input terminal coupled to the output terminal of the comparator and having an output terminal at which is provided the control signal for controlling the amount of delay through the adjustable delay circuit.

13. The frequency doubler of claim 9, wherein the combining circuit includes an EXCLUSIVE-OR logic circuit having a first input terminal coupled to the output terminal of the variable delay circuit, a second input terminal coupled to the reference-clock input terminal, and an output terminal for providing an output signal $V_X$ at a frequency twice the frequency of the reference input signal with a duty cycle controlled by the control signal.

14. The frequency doubler of claim 9, wherein the combining circuit includes an EXCLUSIVE_NOR logic circuit having a first input terminal coupled to the output terminal of the variable delay circuit, a second input terminal coupled to the reference-clock input terminal, and an output terminal for providing an output signal $V_X$ at a frequency twice the frequency of the reference input signal with a duty cycle controlled by the control signal.

15. The frequency doubler of claim 11, wherein the DC reference source includes a voltage divider having a first resistor R1 with one end coupled to a VDDterminal, having a second resistor R2 with one end coupled to a VSS terminal, having a voltage-divider output terminal with the other ends of the first and the second resistors coupled thereto, and having the voltage-divider output terminal coupled to the second input terminal of the comparator, wherein the voltage ratio of the voltage divider determines the duty cycle of the output signal.

16. The frequency doubler of claim 11, wherein the DC reference source is a digital-to-analog converter.

17. A frequency tripler with an adjustable duty cycle, comprising:

a reference-clock input terminal for receiving a reference input signal at a reference frequency $f_{IN}$ and with a 50 percent duty cycle;

a first variable delay circuit for providing a first delayed reference input signal;

a second variable delay circuit for providing a second delayed reference input signal;

wherein each of the variable delay circuits has an input terminal and a control terminal for receiving a control signal for controlling the amount of delay through each of the first and the second variable delay circuits;

a combining circuit for logically combining the reference input signal, the first delayed reference input signal, and the second delayed input signal to provide an output signal at an output terminal which output signal has a frequency three times the frequency of the reference input signal;

a control signal generator circuit having an input terminal coupled to the output terminal of the combining circuit through an average-value circuit, having another input terminal coupled to a DC reference voltage from a DC reference source, and having an output terminal coupled to the control terminals of the variable delay circuits for receiving the control signal which controls the amount of delay through the variable delay circuits, wherein the control signal generator compares the average value of the output signal of the combining circuit at three times the frequency of the reference input signal to the DC reference voltage to provide the control signal for controlling the amount of delay through the adjustable delay circuit; and wherein the DC reference voltage determines the duty cycle of the output signal.

18. The frequency tripler of claim 17, wherein the control signal generator includes a first low-pass filter having an input terminal coupled to the output terminal of the combining circuit and having an output terminal;

wherein the control signal generator includes a comparator having one input terminal coupled to the DC reference source, having a second input terminal coupled to the output terminal of the first low-pass filter, and having an output terminal; and wherein the control signal generator includes a second low-pass filter having an input terminal coupled to the output terminal of the comparator and having an output terminal at which is provided the control signal for controlling the amount of delay through the variable delay circuit.

19. A frequency multiplier which provides an output signal which has a frequency which is N times the frequency of an input signal and which has an adjustable duty cycle, comprising:

a reference-clock input terminal for receiving a reference input signal at a reference frequency $f_{IN}$ and with a 50 percent duty cycle;

a plurality of (N−1) variable delay circuits for providing a plurality of progressively delayed reference input signals at respective output terminals;

wherein each of the variable delay circuits has an input terminal communicatively coupled to said reference input signal and a control terminal for receiving a control signal for controlling the amount of delay through each of the variable delay circuits;

a combining circuit for logically combining the reference input signal, and the plurality of progressively delayed reference input signals to provide an output signal at an output terminal of the combining circuit which has a frequency N times the frequency of the reference input signal;

a control signal generator circuit which has an input terminal coupled to the output terminal of the combining circuit through an average-value circuit, having another input terminal coupled to a DC reference voltage from a DC reference source, and which has an output terminal coupled to the control terminals of the variable delay circuits for providing the control signal which control the amount of delay through the variable delay circuits, wherein the control signal generator compares the average value of the output signal of the combining circuit at N times the frequency of the reference input signal to the DC reference voltage to provide the control signal for controlling the amount of delay through the adjustable delay circuits; and wherein the DC reference voltage determines the duty cycle of the output signal.

20. The frequency multiplier of claim 19, wherein the plurality of N−1 variable delay circuits are connected in series to the reference-clock input terminal.

21. The frequency multiplier of claim 19, wherein the plurality of N−1 variable delay circuits have their input terminals connected in parallel to the reference-clock input terminal.

22. The frequency multiplier of claim 19, wherein N is an odd integer.

23. The frequency multiplier of claim 19, wherein the progressively delayed reference input signals are delayed in increments of Tin/2N where Tin is the period of the input reference signal.

24. The frequency multiplier of claim 19, wherein the control signal generator includes a first low-pass filter having an input terminal coupled to the output terminal of the combining circuit and an output terminal;

wherein the control signal generator includes a comparator having one input terminal coupled to the DC voltage reference source, having a second input terminal coupled to the output terminal of the first low-pass filter, and having an output terminal; and wherein the control signal generator includes a second low-pass filter having an input terminal coupled to the output terminal of the comparator and having an output terminal at which is provided the control signal for controlling the amount of delay through the variable delay circuits.

* * * * *